United States Patent
Kawakami et al.

(10) Patent No.: US 7,123,642 B2
(45) Date of Patent: Oct. 17, 2006

(54) MULTI-WAVELENGTH LASER DEVICE

(75) Inventors: Toshiyuki Kawakami, Nara (JP); Mototaka Taneya, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 239 days.

(21) Appl. No.: 10/789,848

(22) Filed: Feb. 27, 2004

(65) Prior Publication Data

US 2004/0196877 A1 Oct. 7, 2004

(30) Foreign Application Priority Data

Apr. 1, 2003 (JP) ............................. 2003-097954

(51) Int. Cl.
H01S 5/00 (2006.01)

(52) U.S. Cl. ..................... 372/50.11; 372/12

(58) Field of Classification Search ............ 372/50.12, 372/50.1, 36, 25, 29.013, 29.016, 23
See application file for complete search history.

(56) References Cited

U.S. PATENT DOCUMENTS 5,699,375 A * 12/1997 Paoli ....................... 372/50.11
5,963,568 A * 10/1999 Paoli ........................... 372/23
6,259,121 B1 * 7/2001 Lemoff et al. ................ 257/88
6,893,888 B1 * 5/2005 Nemoto ........................ 438/22
2004/0028097 A1 * 2/2004 Miyabe et al. ................ 372/36

FOREIGN PATENT DOCUMENTS

| JP | 11-097804 | 4/1999 |
| JP | 11-186651 | 7/1999 |
| JP | 11-340587 | 12/1999 |
| JP | 2000-174398 | 6/2000 |
| JP | 2001-185811 | 7/2001 |
| JP | 2001-230502 | 8/2001 |
| JP | 2001-237495 | 8/2001 |

* cited by examiner

*Primary Examiner*—Minsun Oh Harvey
*Assistant Examiner*—Tuan N. Nguyen
(74) *Attorney, Agent, or Firm*—Morrison & Foerster LLP

(57) ABSTRACT

A multi-wavelength laser device includes at least two of a blue laser diode, a red laser diode, and an infrared laser diode, which are arranged in the same direction on the same base. One laser light emission point is arranged behind another in increasing order of wavelengths of the laser diodes.

14 Claims, 18 Drawing Sheets

MULTI-WAVELENGTH LASER DEVICE

This nonprovisional application is based on Japanese Patent Application No. 2003-097954 filed with the Japan Patent Office on Apr. 1, 2003, the entire contents of which are hereby incorporated by reference.

BACKGROUND OF THE INVENTION

1. Field of the Invention

The present invention relates to an optical pickup device compatible with plural kinds of optical disks, and more particularly to a multi-wavelength laser device capable of emitting laser beams with a plurality of wavelengths.

2. Description of the Background Art

In recent years, it has been actively tried to develop record media with increased record density and also recording and reproducing devices therefor. Digital versatile disks (DVD), for example, are being widely used in a variety of fields as record media for images and are expected to be in increased demand in the future. Therefore, there is a growing demand for developing an optical pickup compatible with a conventional compact disk (CD), a recordable and reproducible CD (CD-R, CD-RW), and a DVD.

At present, a semiconductor laser diode (LD) with a 650 nm wavelength band is used as a light source for reproduction of DVDs. An LD with a 780 nm wavelength band is used for CDs and CD-Rs. An LD with a 410 nm wavelength band is to be used for the next generation DVDs. There are differences between recording and reproducing standards on the CD, CD-R/RW and DVD, and it is impossible for only one type of an LD to cover such different standards. Thus, it is desired to install a pickup or pickups capable of reading and writing with laser beams of different kinds of wavelengths in order to ensure the recording and reproducing compatibility between various devices.

In this case, three pickups corresponding to respective wavelengths may be installed in a recording and reproducing device. However, installing as many as three pickups in a recording and reproducing device inevitably increases the size of the recording and reproducing device and also causes increase in costs. Therefore, it is preferable that one pickup enables reading and writing for three kinds of media. To this end, it becomes necessary to use a multi-wavelength laser device capable of emitting three wavelengths for an optical pickup. Specifically, it is desired to provide a semiconductor laser device in which an infrared semiconductor LD with a wavelength of 780 nm, a red semiconductor LD with a wavelength of 650 nm and a blue semiconductor LD with a wavelength of 410 nm are arranged proximate to each other.

A schematic perspective view in FIG. 18 shows an exemplary multi-wavelength semiconductor laser device formed by integrating three kinds of semiconductor LDs with emission wavelengths different from each other (see, for example, Japanese Patent Laying-Open No. 2000-174398). The device of FIG. 18 is a so-called hybrid-type multi-wavelength laser device in which LDs as separately fabricated are integrated together. More specifically, along a flat side surface of a heat sink 131, semiconductor LDs 132, 133 and 134 respectively having infrared, red and blue emission wavelengths are mounted in this order such that emission directions of their laser beams are substantially parallel to each other. Wires 135, 136 and 137 are connected to these LDs 132, 133 and 134, respectively, so that each LD can operate independently. Such a hybrid-type multi-wavelength laser device is advantageous in that a defective LD can be replaced with a normal LD, thereby preventing reduction in yields of the multi-wavelength laser devices.

On the other hand, it has not been considered how to arrange three or more LDs having emission wavelengths different from each other when they are integrated together. According to thought of the inventors, however, in the case of integrating a plurality of LDs for use, relation between the arrangement of a plurality of LDs and the optical system of the optical pickup should be taken into consideration and it is important to arrange a plurality of LDs appropriately.

Ideally, it is desirable to prepare one optical system corresponding to one wavelength of the laser, similarly as in the case where three pickups are installed in one recording and reproducing device. This, however, does not bring about the advantage of integrating a plurality of LDs in one pickup. Similarly as in a pickup equipped with an LD of only one emission wavelength, therefore, a single optical system is to be preferably used even in a pickup including a plurality of LDs. In the laser device with a plurality of LDs integrated, on the other hand, it is physically impossible to coincidently position the emission points of those LDs at one point. Therefore, it is difficult for a single optical system to perform the functions of a plurality of optical systems that are optimum for respective LDs with respective wavelengths.

SUMMARY OF THE INVENTION

In view of the above-described status of the prior art, an object of the present invention is to improve the relation between a single optical system and a multi-wavelength laser device including a plurality of LDs emitting light beams having wavelengths different from each other.

According to the present invention, a multi-wavelength laser device includes at least two of a blue laser diode, a red laser diode, and an infrared laser diode, which are arranged in the same direction on the same base. The emission point of a laser diode having a longer wavelength is positioned behind the emission point of another laser diode having a shorter wavelength in their light emitting direction.

At least two laser diodes may be formed monolithically on the same substrate. On the other hand, at least two separate laser diodes may be mounted on a base by using respective solders with different melting points.

Preferably, the base is provided with a cut for ensuring passage of laser light from each of the laser diodes. In the case that at least two laser diodes are formed monolithically on a substrate, the substrate is preferably provided with a cut for ensuring passage of laser light from each of the laser diodes. The laser diodes may be mounted with their p-side down.

In a method of fabricating the multi-wavelength laser device according to the present invention, at least two laser diodes are preferably mounted on a base by using solders with respective different melting points in decreasing order of the melting points.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the present specification, it is intended that a "front side" of an LD means a surface side selected from opposite mirror facets of a cavity in the LD, from which laser light is emitted. Furthermore, a "laser light emission point" means a point at which the mirror facet on the front side and a stripe-shaped waveguide of the LD intersect each other.

According to study of the inventors, one problem in collecting laser beams of different wavelengths with a single optical system is difference in focal length due to different wavelengths. A lens used in the optical system has a different reflectance depending on the wavelength. A focal length for blue of a short wavelength is short while a focal length for infrared of a long wavelength is long. If a plurality of optical systems can be prepared, different lenses could be used to eliminate the difference in focal length between light beams of different wavelengths. In a single optical system, however, variation in focal length depending on wavelengths causes focal shifts on a disk surface, which may cause errors in reading and writing.

Such difference in focal length varies from one design to another of optical systems. Generally, there is a difference of about a few tens μm to 100 μm between a blue LD and an infrared LD. In view of this, the problem of difference in focal length among different wavelengths can be solved by relatively arranging LDs of respective wavelengths so as to compensate difference in distance to an image point in association with difference in focal length of the optical system, i.e., by relatively adjusting positions of the laser light emission points of the LDs.

(Embodiment 1)

Figure 1:
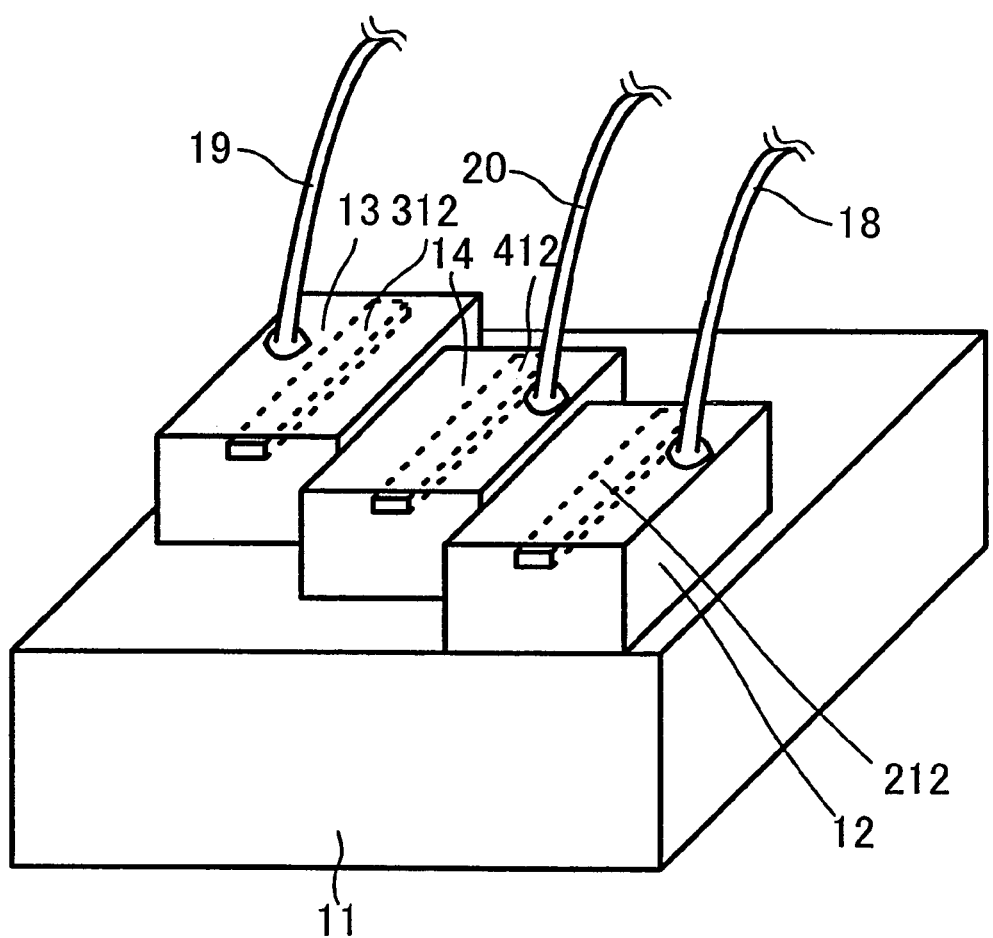
FIG. 1 is a schematic perspective view of a header portion of a stem in a multi-wavelength laser device according to embodiment 1 of the present invention.

FIG. 1 is a perspective view schematically illustrating a front portion of a header of a multi-wavelength laser device in embodiment 1 of the present invention. At the front portion of the header, a blue LD 12, an infrared LD 13 and a red LD 14 are disposed on a main surface of a support base 11. These LDs have respective ridge stripes 212, 312 and 412, each including a stripe-shaped waveguide. A first wire 18, a second wire 19 and a third wire 20 are connected to LDs 12, 13 and 14, respectively, for supplying power so that they can operate independently.

Support base 11 is made of metal including copper as a main component and serves as a heat sink. The LDs on support base 11 are mounted such that laser beams emitted therefrom are approximately parallel to each other. Each LD is mounted with its n-electrode facing on support base 11, i.e., with its p-side up and has the wire connected on the p-electrode side. These wires are connected to locations away from just above ridge stripes 212, 312 and 412 of the corresponding LDs so that the stripe-shaped waveguides are not damaged by wire bonding. A multilayer reflective film is formed on the rear side of each LD, and laser light is emitted from the front side when electric current more than the threshold is injected between support base 11 and the wire. Here, red LD 14 is arranged 50 μm behind blue LD 12 in the state facing the front side, and infrared LD 13 is arranged 50 μm behind red LD 14. A method of fabricating the multi-wavelength laser device of FIG. 1 will now be described.

Figure 2:
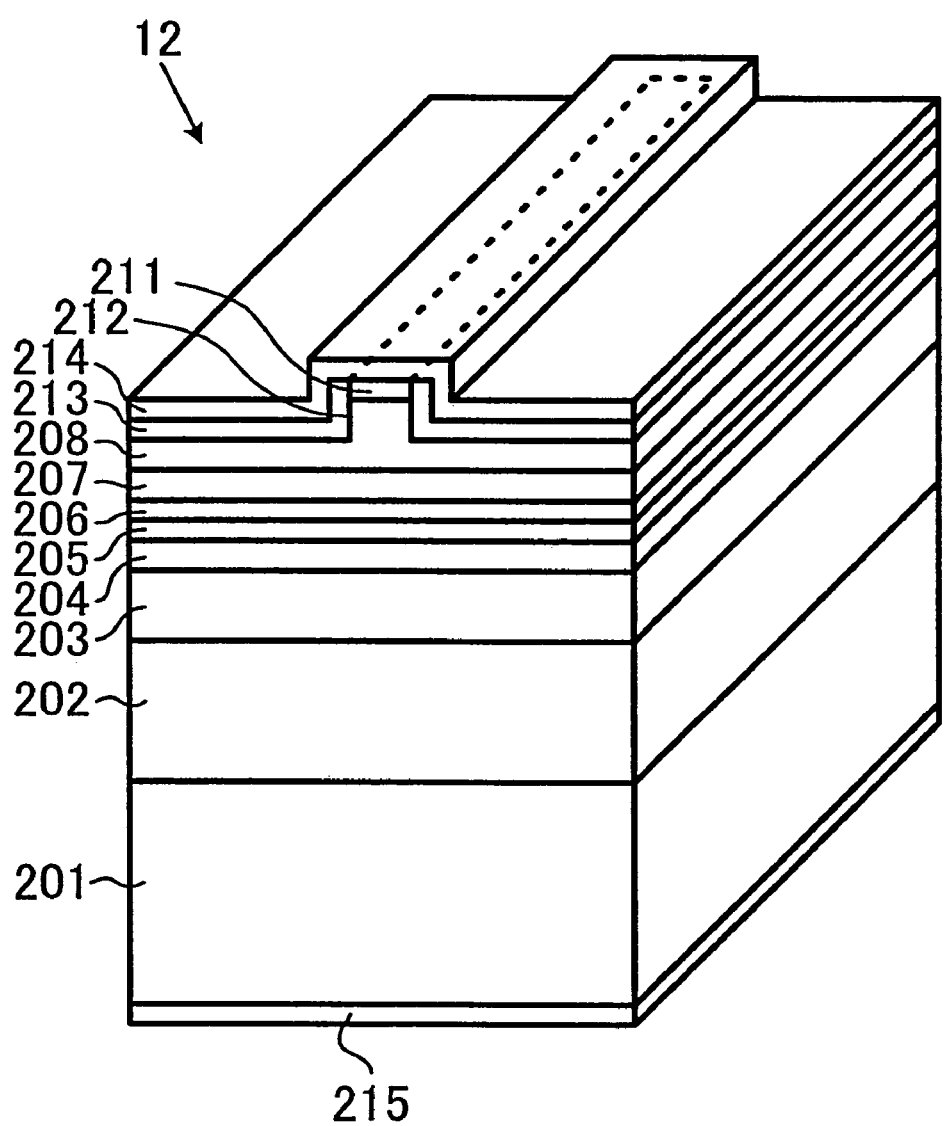
FIG. 2 is a schematic perspective view of a blue LD included in the header portion of FIG. 1.

First, referring to FIG. 2, fabrication of blue LD 12 for emitting blue laser light is described. LD 12 includes a plurality of GaN-based semiconductor layers, which are formed on an n-type GaN substrate 201 by metalorganic chemical vapor deposition (MOCVD). More specifically, a wafer is grown by stacking an n-type GaN lower contact layer 202, an n-type $Al_{0.1}Ga_{0.9}N$ lower cladding layer 203, an n-type GaN lower guide layer 204, an active layer 205 having a multiple quantum well layer structure formed of an alternate stack structure of $In_{x1}Ga_{1-x1}N$ and $In_{x2}Ga_{1-x2}N$ (where x1>x2), a p-type $Al_{0.2}Ga_{0.8}N$ evaporation preventing layer 206, a p-type GaN upper guide layer 207, a p-type $Al_{0.1}Ga_{0.9}N$ upper cladding layer 208, and a p-type GaN upper contact layer 211 in this order on a first main surface of n-type GaN substrate 201. It is noted that active layer 205 has its composition and structure set to radiate light of a wavelength of about 405 nm.

Then, a photolithographic process is used to form a stripe-shaped resist (not shown) having a width of approximately 2 μm, and ridge stripe 212 including upper cladding layer 208 and upper contact layer 211 is formed by reactive ion etching (RIE) or the like. A stripe-shaped waveguide is thus formed. Thereafter, a silicon oxide film is formed by evaporation followed by lift-off so that current constricting layers 213 for allowing current injection only from the top portion of ridge stripe 212 are formed on both the sides of ridge stripe 212. In addition, a p-electrode 214 is formed to cover ridge stripe 212 by stacking Pd/Au in this order by vacuum evaporation or the like. P-electrode 214 preferably includes a broad region besides above ridge stripe 212 in consideration of a wire bonding region.

Then, entire thickness of the wafer is adjusted by reducing the thickness from a second main surface side of substrate 201 by polishing or the like. Thereafter, an n-electrode 215 is formed by stacking Ti/Al in this order on the second main surface side of substrate 201 by vacuum evaporation or the like. Furthermore, in order to improve adhesiveness of LDs when being mounted, Mo/Au are stacked in this order by vacuum evaporation, thereby finishing the wafer. The finished wafer is cleaved with a width of 650 μm to form the mirror facets of the laser. After the cleavage, a multilayer reflective film (not shown) including stacked layers of two or more kinds of dielectric is formed on the rear side of the laser bar, allowing laser light to be emitted from the front side. The wafer as divided in a bar shape is further divided into chips each having a width of about 200–300 μm, thereby resulting in blue LDs 12.

Figure 3:
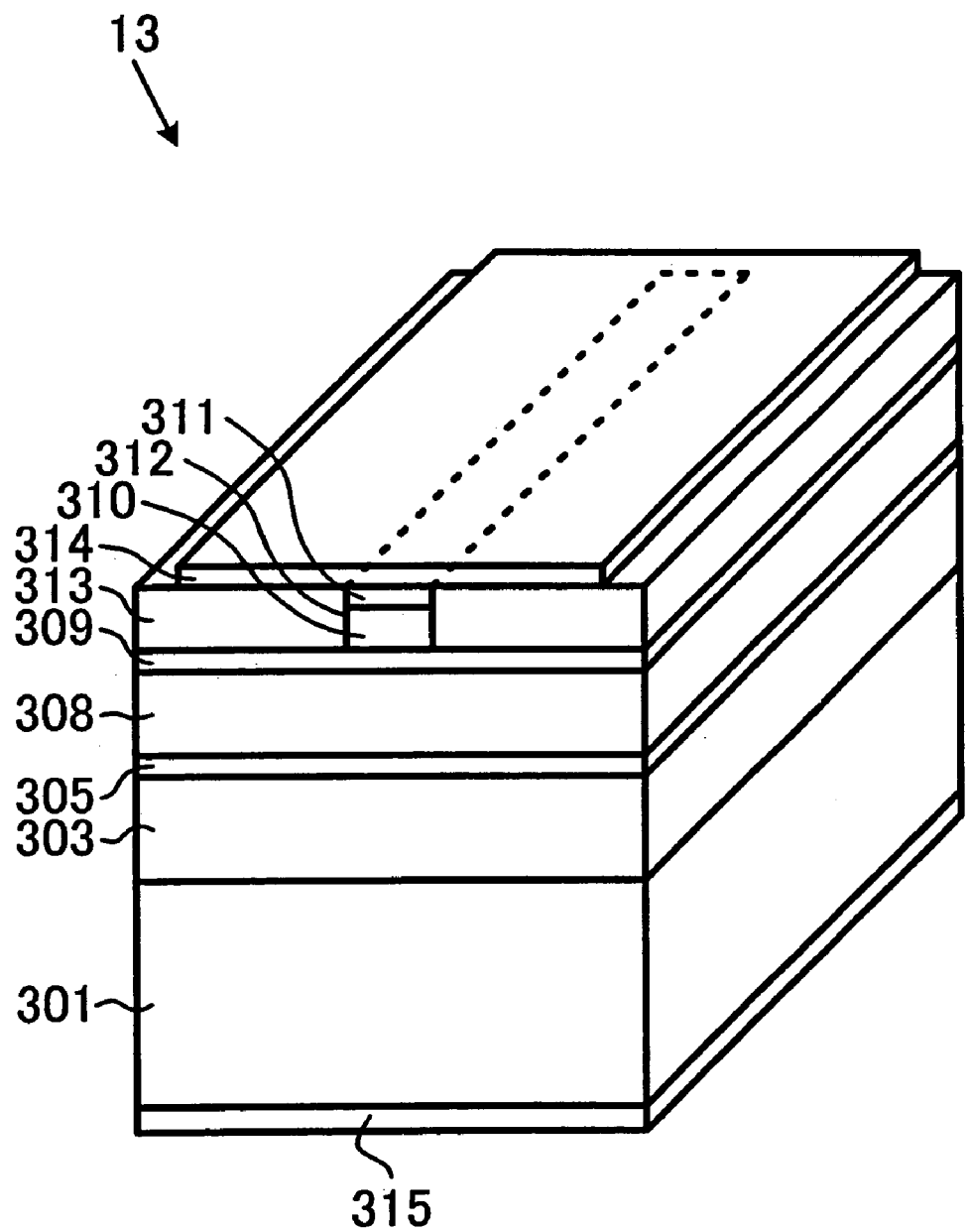
FIG. 3 is a schematic perspective view of an infrared LD included in the header portion of FIG. 1.

Now referring to FIG. 3, fabrication of infrared LD 13 for emitting infrared laser light will be described. LD 13 includes a plurality of AlGaAs-based semiconductor layers, which are formed on an n-type GaAs substrate 301 by MOCVD or molecular beam epitaxy (MBE). More specifically, a wafer is grown by stacking an n-type $Al_{0.55}Ga_{0.45}As$ lower cladding layer 303, an active layer 305 having a multiple quantum well layer structure formed of an alternate stacked structure of $Al_{x3}Ga_{1-x3}As$ and $Al_{x4}Ga_{1-x4}As$ (where x3>x4), a p-type $Al_{0.55}Ga_{0.45}As$ upper first cladding layer 308, a p-type GaAs etch stop layer 309, a p-type $Al_{0.55}Ga_{0.45}As$ upper second cladding layer 310, a p-type GaAs upper contact layer 311 in this order on a first main surface of n-type GaAs substrate 301. It is noted that active layer 305 has its composition and structure set to radiate light of a wavelength of approximately 780 nm.

Then, after a stripe-shaped mask (not shown) of silicon oxide, silicon nitride or the like is formed with a width of approximately 5 μm by a photolithographic process, etching is carried out until etch stop layer 309 is reached. Thus, ridge stripe 312 including upper second cladding layer 310 and upper contact layer 311 is formed. In this way, a stripe-shaped waveguide is formed. On both the sides of ridge stripe 312, an n-type GaAs filling layers 313 are grown for light confinement and for allowing current injection only from the top portion of ridge stripe 312. In addition, a p-electrode 314 is formed to cover ridge stripe 312 by stacking Zn/Au in this order by vacuum evaporation or the like. Preferably, p-electrode 314 is also provided with a broad region in consideration of wire bonding.

Thereafter, thickness of the entire wafer is adjusted by reducing the thickness from a second main surface side of n-type GaAs substrate 301 by wet-etching or the like. Thereafter, an n-electrode 313 is formed on the second main surface side of n-type GaAs substrate 301 by stacking Ni/Ge/Au in this order by vacuum evaporation or the like. Furthermore, to improve adhesiveness of LDs when being mounted, Mo/Au are stacked in this order by vacuum evaporation, thereby finishing the wafer. The finished wafer is cleaved with a width of 250 μm to form the mirror facets of the laser. After the cleavage, a multilayer reflective film (not shown) including stacked layers of two or more kinds of dielectric is formed on the rear side of the laser bar, allowing laser light to be emitted from the front side. The wafer as divided in a bar shape is further divided into chips each having a width of approximately 200–300 μm, resulting in infrared LDs 13.

Figure 4:
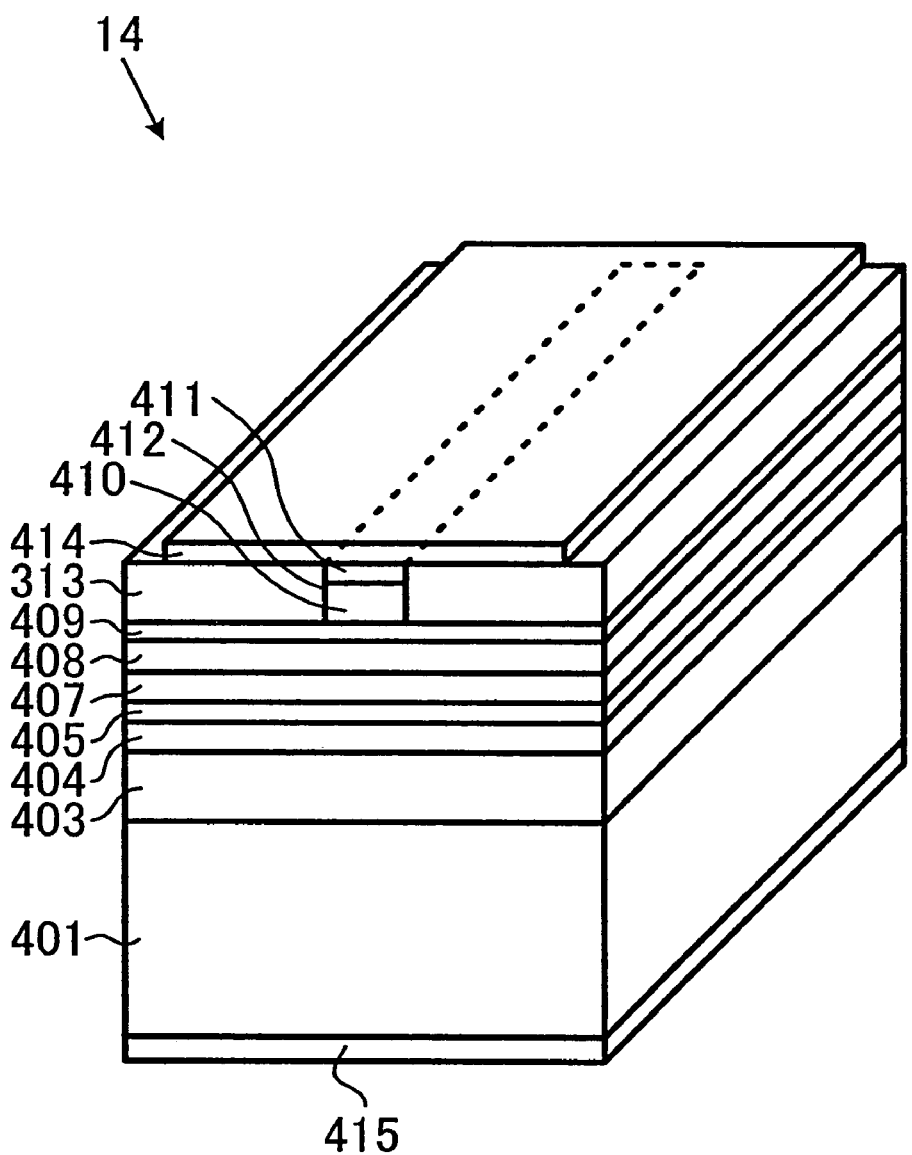
FIG. 4 is a schematic perspective view of a red LD included in the header portion of FIG. 1.

Now referring to FIG. 4, fabrication of red LD 14 for emitting red laser light will be described. LD 14 includes a plurality of InAlGaP-based semiconductor layers, which are formed on an n-type GaAs substrate 401 by MBE. More specifically, a wafer is grown by stacking an n-type $Al_{0.35}Ga_{0.15}In_{0.5}P$ lower cladding layer 403, an n-type $Al_{0.25}Ga_{0.25}In_{0.5}P$ lower guide layer 404, an active layer 405 having a multiple quantum well layer structure formed of an alternate stacked layer structure of $In_{x5}Ga_{1-x5}P$ and $Al_{x6}Ga_{x7}In_{1-x6-x7}$, a p-type $Al_{0.25}Ga_{0.25}In_{0.50}P$ upper guide layer 407, a p-type $Al_{0.35}Ga_{0.15}In_{0.50}P$ upper first cladding layer 408, a p-type $In_{0.5}Ga_{0.5}P$ etch stop layer 409, a p-type $Al_{0.35}Ga_{0.15}In_{0.50}P$ upper second cladding layer 410, and a p-type GaAs upper contact layer 411 in this order on a first main surface of n-type GaAs substrate 401. It is noted that active layer 405 has its composition and structure set to radiate light of a wavelength of 650 nm.

Then, after a stripe-shaped mask (not shown) of silicon oxide or silicon nitride is formed with a width of approximately 5 μm by a photolithographic process, etching is carried out until etch stop layer 409 is reached. In this way, ridge stripe 412 including upper second cladding layer 410 and upper contact layer 411 is formed to enable guiding of light. On both the sides of ridge stripe 412, n-type GaAs filling layers 413 are grown for light confinement and for allowing current injection only from the top portion of ridge stripe 412. A p-electrode 414 is formed to cover ridge stripe 412 by stacking Zn/Au in this order by vacuum evaporation or the like. Preferably, p-electrode 414 is also provided with a broad region in consideration of wire bonding.

Thereafter, thickness of the entire wafer is adjusted by reducing the thickness from a second main surface side of n-type GaAs substrate 401 by wet-etching or the like. Then, an n-electrode 415 is formed on the second main surface side of n-type GaAs substrate 401 by stacking Ni/Ge/Au in this order by vacuum evaporation or the like. Furthermore, in order to improve adhesiveness of LDs when being mounted, Mo/Au are stacked in this order by vacuum evaporation, thereby finishing the wafer. The finished wafer is cleaved with a width of 250 μm to form the mirror facets of the laser. After the cleavage, a multilayer reflective film (not shown) formed of a stacked layers of two or more kinds of oxides is formed on the rear side of the laser bar, allowing laser light to be emitted from the front side. The wafer divided in a bar shape is further divided into chips each having a width of about 200–300 μm thereby resulting in red LDs 14.

By utilizing the cleavability of GaAs substrates 301 and 401 in division into chips of infrared LDs 13 and red LDs 14, it is possible to form cleaved planes parallel to the direction of ridge stripes 312 and 412 that is the light emitting direction. The cleaved plane can be used as an alignment reference when the LD is mounted. On the other hand, dividing grooves need to be provided on the bar-shaped wafer when the wafer is divided into chips. By forming these dividing grooves with a photolithographic process and etching in combination, a distance between the ridge stripe and the side face of every LD can be defined to preferably control the emission point position. Such chip-dividing grooves may be formed before the wafer is divided into the bar shapes.

The resultant LDs are mounted on support base 11. Blue LD 12 is initially placed on support base 11, and infrared LD 13 is then mounted in the vicinity thereof such that the emission point of infrared LD 13 is located at a position 100 μm behind the emission point of blue LD 12 in their light emitting direction. Red LD 14 is mounted between blue LD 12 and infrared LD 13 such that the emission point of red LD 14 is located at a position 50 μm behind the emission point of blue LD 12 in their light emitting direction. At this time, it should be noted that the stripe directions of these LDs are parallel to each other. Furthermore, spacing between LDs is set to about 10 μm to a few tens μm so as to avoid contact between LDs which makes a short circuit.

In the mounting, $Au_{80}Sn_{20}$ solder is used for blue LD 12, $Au_{10}Sn_{90}$ solder is used for infrared LD 13, and In solder is used for red LD 14. $Au_{80}Sn_{20}$ solder, $Au_{10}Sn_{90}$ solder, and In solder are used in decreasing order of their meting points to attach those LDs to support base 11. Specifically, blue LD 12 having the highest heat resistance is initially mounted, infrared LD 13 is then mounted, and red LD 14 having the lowest heat resistance is finally mounted. Although the same solder material might be used for those LDs, solders having different melting points are conveniently used in this way to attach a plurality of LDs to support base 11 so that one LD can be mounted without causing positional sift of another already mounted LD. It is noted that solder materials having various melting points can be selected from a variety of solder materials including indium alloys, lead alloys, tin alloys, aluminum alloys, gold alloys, and the like. Although FIG. 1 shows that infrared LD 13, red LD 14 and blue LD 12 are arranged in this order from the left side, it is needless to say that this order may be changed.

Figure 5:
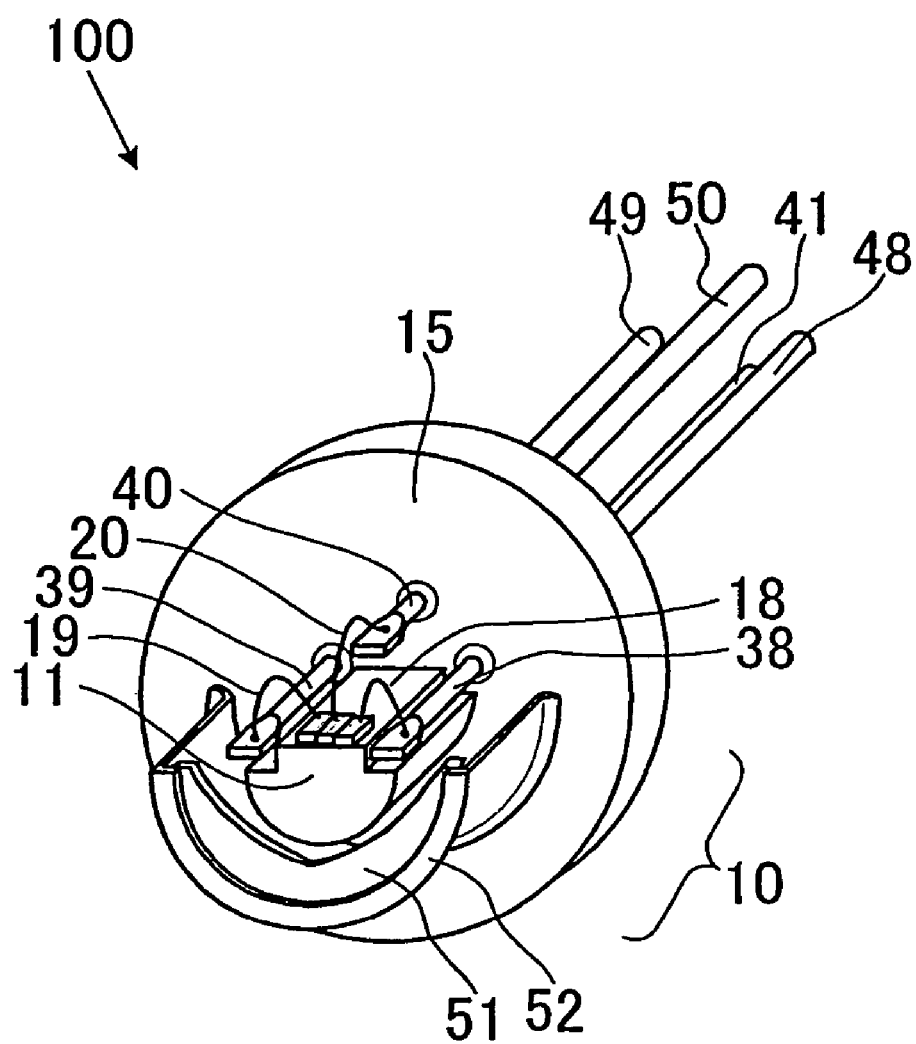
FIG. 5 is a schematic perspective view of the multi-wavelength laser device according to embodiment 1 of the present invention.

Next, as shown in FIG. 5, a wire is connected to each LD to enable external power supply. In FIG. 5, a transparent member 51 and a cap 52 are shown partially cut away to facilitate understanding of the inside of the laser device. Support base 11 together with a circular heat sink disk 15 forms a body of a stem 10 and is connected to a lead 41 external to stem 10 to allow power to be supplied. Pins 38, 39 and 40 for supplying power to the respective p-sides of LDs are insulated from stem 10 and are directly coupled to external leads 48, 49 and 50, respectively. After mounting the LDs, blue LD 12, infrared LD 13 and red LD 14 are connected to pins 38, 39 and 40 by means of wires 18, 19 and 20, respectively. Thereafter, cap 52 having transparent member 51 that can transmit the laser light beams of three wavelengths is connected to stem 10, whereby multi-wavelength laser device 100 is completed.

Figure 6:
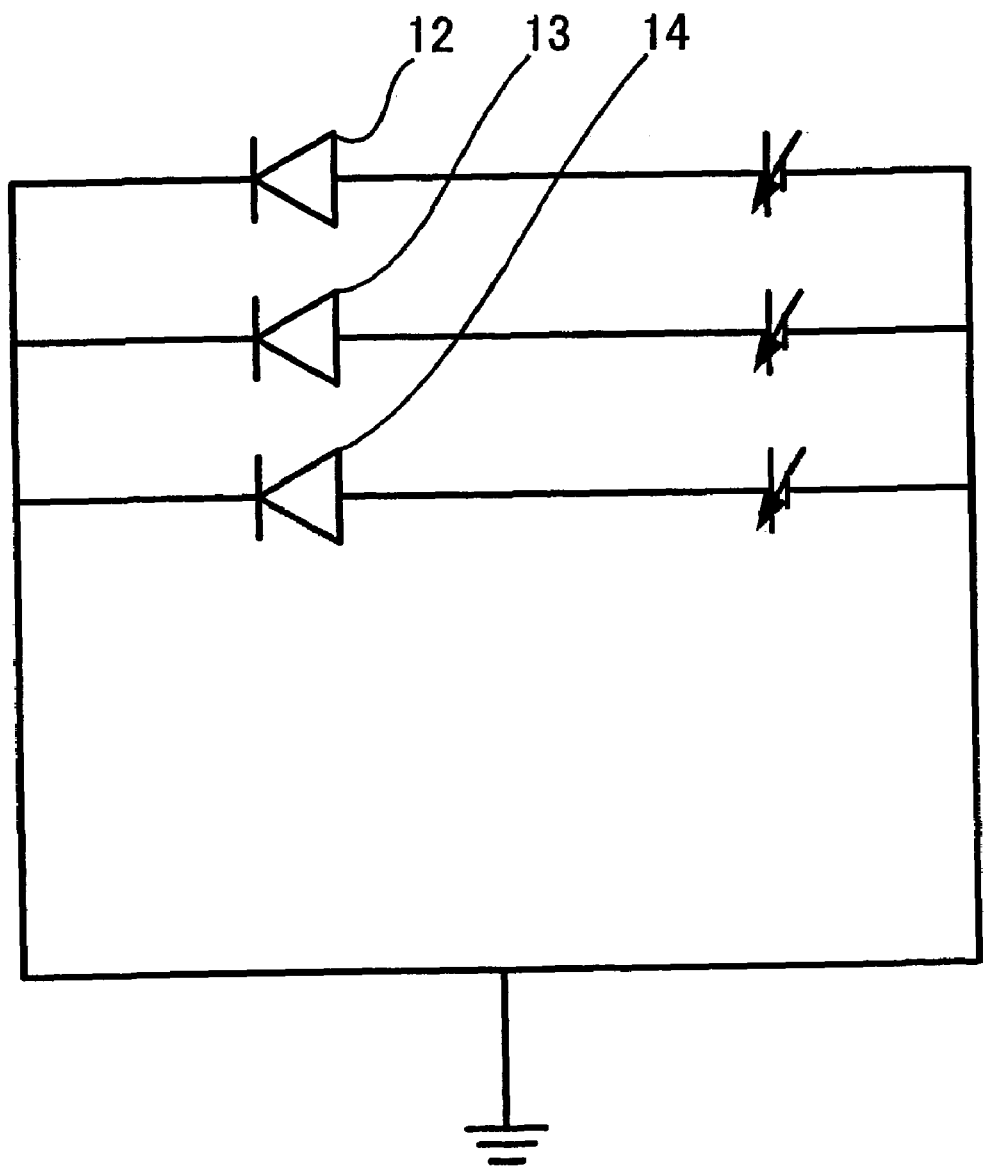
FIG. 6 is an equivalent circuit diagram of the multi-wavelength laser device of FIG. 5.

In FIG. 6, an equivalent circuit of multi-wavelength laser device 100 is shown. Specifically, blue LD 12, infrared LD 13 and red LD 14 each have the n-side connected to the ground and the p-side connected to a power supply source for driving each LD. Each LD can operate independently.

In the present invention, the problem that the focal length varies depending on the wavelength of laser light in the case of using a single optical system for a multi-wavelength laser device can be solved by relatively adjusting the laser light emission point positions. As previously mentioned, in embodiment 1, the emission point position of red LD 14 is located 50 μm behind as compared with blue LD 12 in their light emitting direction, and the emission point position of infrared LD 13 is located 50 μm behind as compared with red LD 14 in their light emitting direction. However, it is needless to say that these distances may be changed among these LDs so as to be adapted to the design of the optical system. Such adjustment of distance can facilitate designing of the optical pickup. In addition, facilitated designing of the optical pickup leads to simplification of the optical system, thereby reducing costs of the pickup.

(Embodiment 2)

Figure 7:
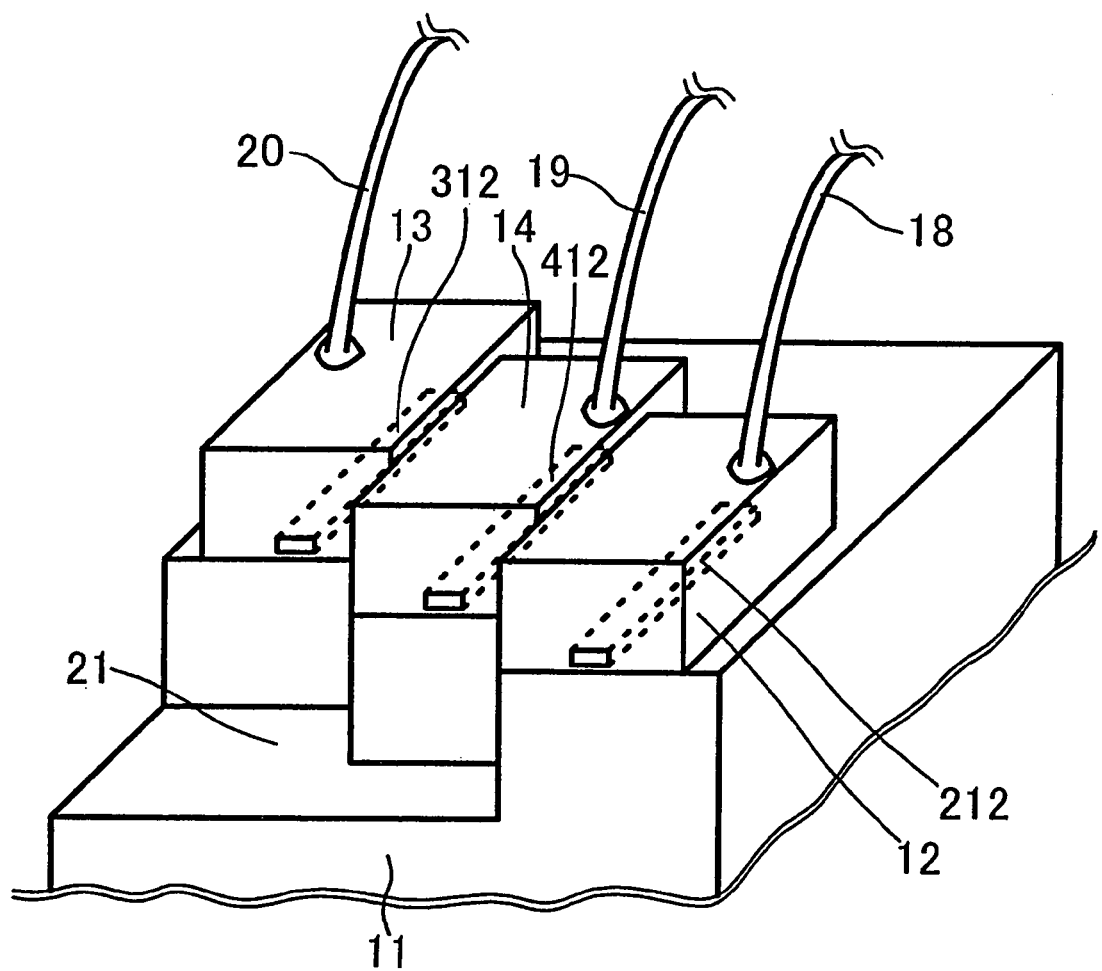
FIG. 7 is a schematic perspective view of a header portion of a stem in a multi-wavelength laser device according to embodiment 2 of the present invention.

FIG. 7 is a perspective view schematically illustrating a front portion of a stem of a multi-wavelength laser device in embodiment 2. In embodiment 2 of FIG. 7, the same or corresponding parts as in embodiment 1 are denoted with the same reference numbers and the detailed description thereof will not be repeated.

Although embodiment 2 is similar to embodiment 1, a characterized feature thereof is that each LD is mounted with its p-side down on support base 11. Such a configuration is advantageous in that distance (height) from support base 11 to the emission point position can easily be controlled. On the other hand, as the emission point position is closer to support base 11 with the p-side down, it is more likely that a part of radiated laser light is interrupted by support base 11. Therefore, support base 11 is provided with a cut 21 in order to prevent laser light from being interrupted by support base 11. Cut 21 will be described below.

Figure 8:
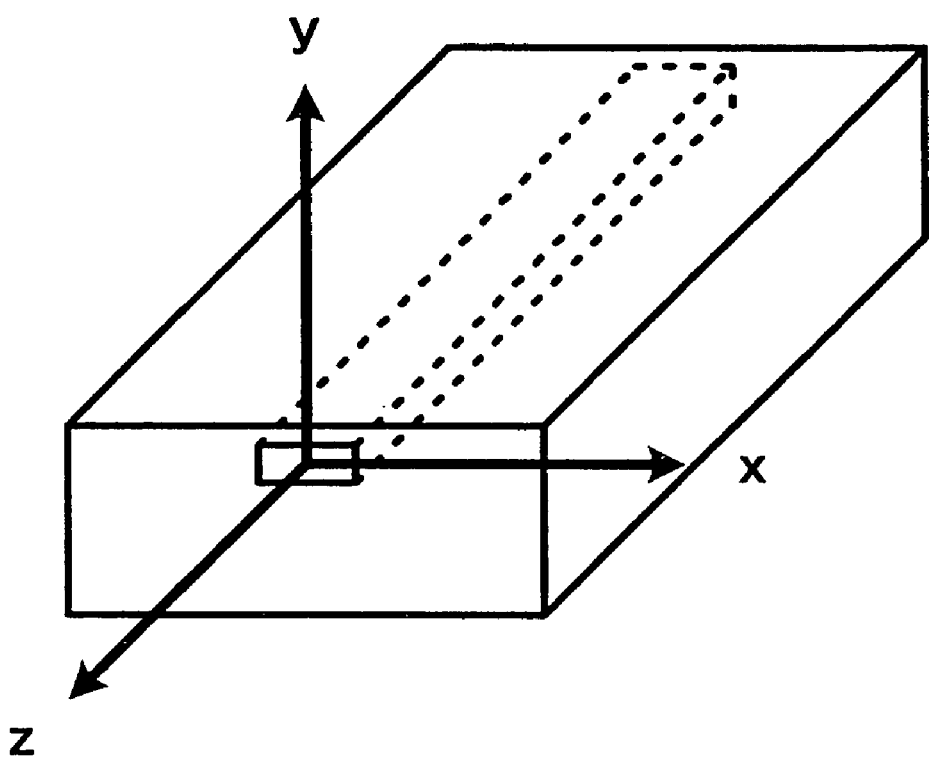
FIG. 8 illustrates coordinate axes based on an LD corresponding to FIG. 2.

As shown in FIG. 8, given that the laser light emission point of the LD is set at an origin point with the light emitting direction being set as a z-axis, a direction normal to the z-axis and parallel to the active layer of the LD being set as an x-axis, and a direction normal to the z-axis and normal to the active layer being set as a y-axis, the position and depth of cut 21 relative to the LD can be calculated from horizontal radiation angle $\theta\|$ and vertical radiation angle $\theta\bot$ of the laser beam emitted from the LD. Specifically, as to a distance D from the z-axis in the y-axis direction, a groove may be formed such that no light shielding exists within the range of D, which satisfies:

$$|D| < L \times \tan(\theta\bot/2) \quad (1)$$

where L denotes distance from the emission point in the z-axis direction ($L \geq 0$). In the case that distance (height) of the emission point from support base 11 is 10 μm and given $\theta\|=10°$ and $\theta\bot=30°$ of the LD, for example, a groove must be formed within the range of D that satisfies expression (1) at positions where L is approximately 37 μm or greater. It is noted that the shape of the groove is not limited to a rectangular parallelepiped in its space and the groove may be shaped with a slope in the z-axis direction.

Similarly, as to distance W in the x-axis direction relative to distance L in the z-axis direction ($L \geq 0$), the LD may be mounted such that no light shielding exists within the range of W, which satisfies:

$$|W| < L \times \tan(\theta\|/2) \quad (2).$$

It is considered that such shielding to the LD might be caused by another neighboring LD. In the present embodiment, however, the distance between the neighboring LDs is at least 100 μm and thus the condition of expression (2) is always met. Satisfying expressions (1) and (2) ensures that laser light is not interrupted. However, considering that the radiation pattern of laser light is in a shape of ellipse, an intersection region between a surface normal to the y-axis of groove 21 (bottom surface) and a surface normal to the x-axis of the groove (side surface) may be formed in a curved surface. Furthermore, a surface normal to the y-axis may be inclined. The shape of groove 21, with which the ellipse-shaped radiation pattern is not interrupted, can be further variously modified to have a V-shaped bottom surface, inclined side surfaces, curved respective surfaces, or the like.

It is needless to say that the similar advantages as in embodiment 1 are also obtained in embodiment 2.

(Embodiment 3)

Figure 9:
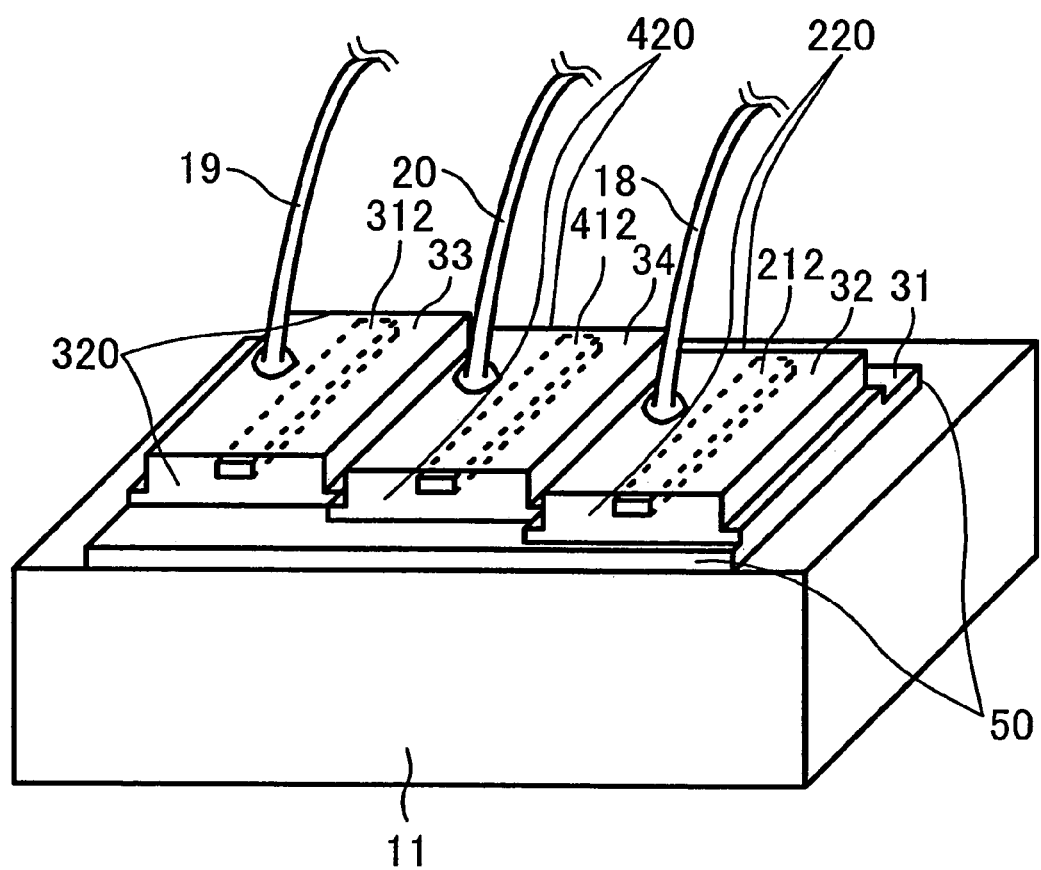
FIG. 9 is a schematic perspective view of a header portion of a stem in a multi-wavelength laser device according to embodiment 3 of the present invention.

FIG. 9 is a perspective view schematically illustrating a front portion of a stem of a multi-wavelength laser device in embodiment 3. In embodiment 3 of FIG. 9 also, the same or corresponding parts as in embodiment 1 are denoted with the same reference numbers and the detailed description thereof will not be repeated.

A characterized feature of embodiment 3 is that an LD 31 mounted on support base 11 is a monolithic type that can emit light beams of different wavelengths on the same substrate. Specifically, in LD 31, a blue laser portion 32, an infrared laser portion 33 and a red laser portion 34 are formed on the same substrate by crystal growth. Laser portions 32, 33 and 34 respectively include corresponding stripe-shaped waveguides 212, 312 and 412 and can be supplied with power independently. Furthermore, each of mirror facets 220, 320 and 420 of the laser portions is an etched mirror, and LD 31 is formed by division along a dividing line 50 in the direction normal to the cavity.

FIGS. 10 to 15 are cross sectional views schematically showing the fabricating steps of LD 31. LD 31 is formed on n-type GaAs substrate by MOCVD or MBE. Here, blue laser portion 32 is fabricated, sequentially followed by infrared laser portion 33 and red laser portion 34, in decreasing order of their heat resistance to prevent high heat loads on red laser portion 34 having the lowest heat resistance.

Figure 10:
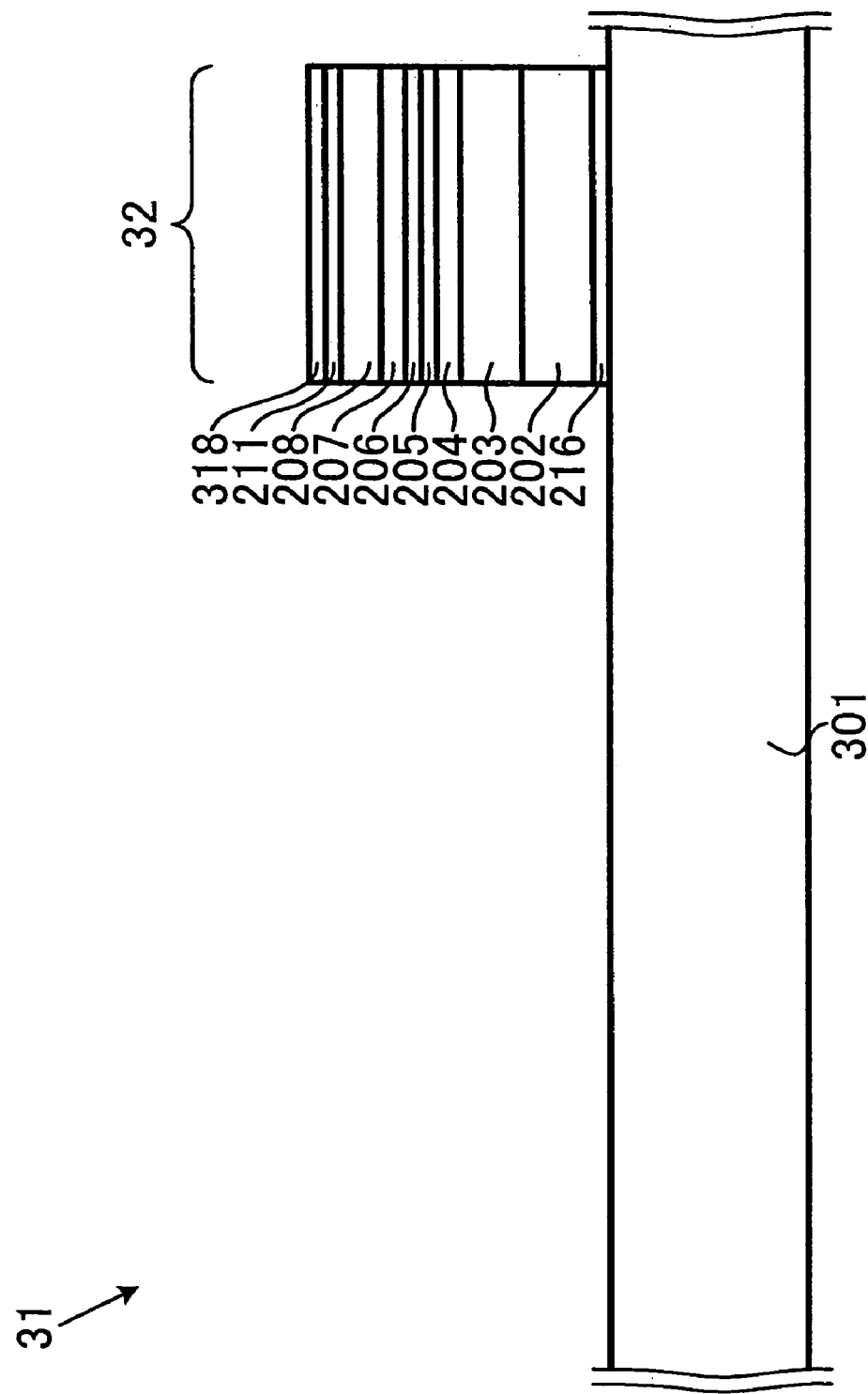
FIG. 10 is a schematic cross sectional view showing a fabricating step of the blue laser portion in FIG. 9.

More specifically, as shown in FIG. 10, blue laser portion 32 is first formed by MOCVD. Initially, an n-type GaN buffer layer 216 is deposited on n-type GaAs substrate 301 so that a GaN-based semiconductor layer having a different lattice constant can be grown with good crystallinity over the GaAs substrate. Thereafter, similarly to the blue LD in embodiment 1, the layers up to p-type GaN upper contact layer 211 are formed. Then, a protective film 318 made of silicon oxide, silicon nitride or the like is formed on the entire surface of the wafer by CVD or vacuum evaporation, and periodic strip-like openings are provided in this protective film by a photolithographic process and etching. The widths of each strip-like protective film 318 and each opening are set to 200 µm and 550 µm, respectively.

The strip-like openings are dug down by dry-etching such as reactive ion etching (RIE) to form strip-like mesas for serving as blue laser portions 32. As a result, the strip-like mesas for serving as blue laser portions 32 are periodically present on the wafer, and n-type GaAs substrate 301 is exposed in a gap between these strip-like mesas where the infrared laser portion and the red laser portion are to be formed. It is noted that in FIG. 10, there are representatively shown only one mesa for serving as blue laser portion 32 as well as only one gap where the infrared portion and the red laser portion are to be formed, and the other portions are not shown. The shown area is similar in each of FIGS. 10 to 15.

Figure 11:
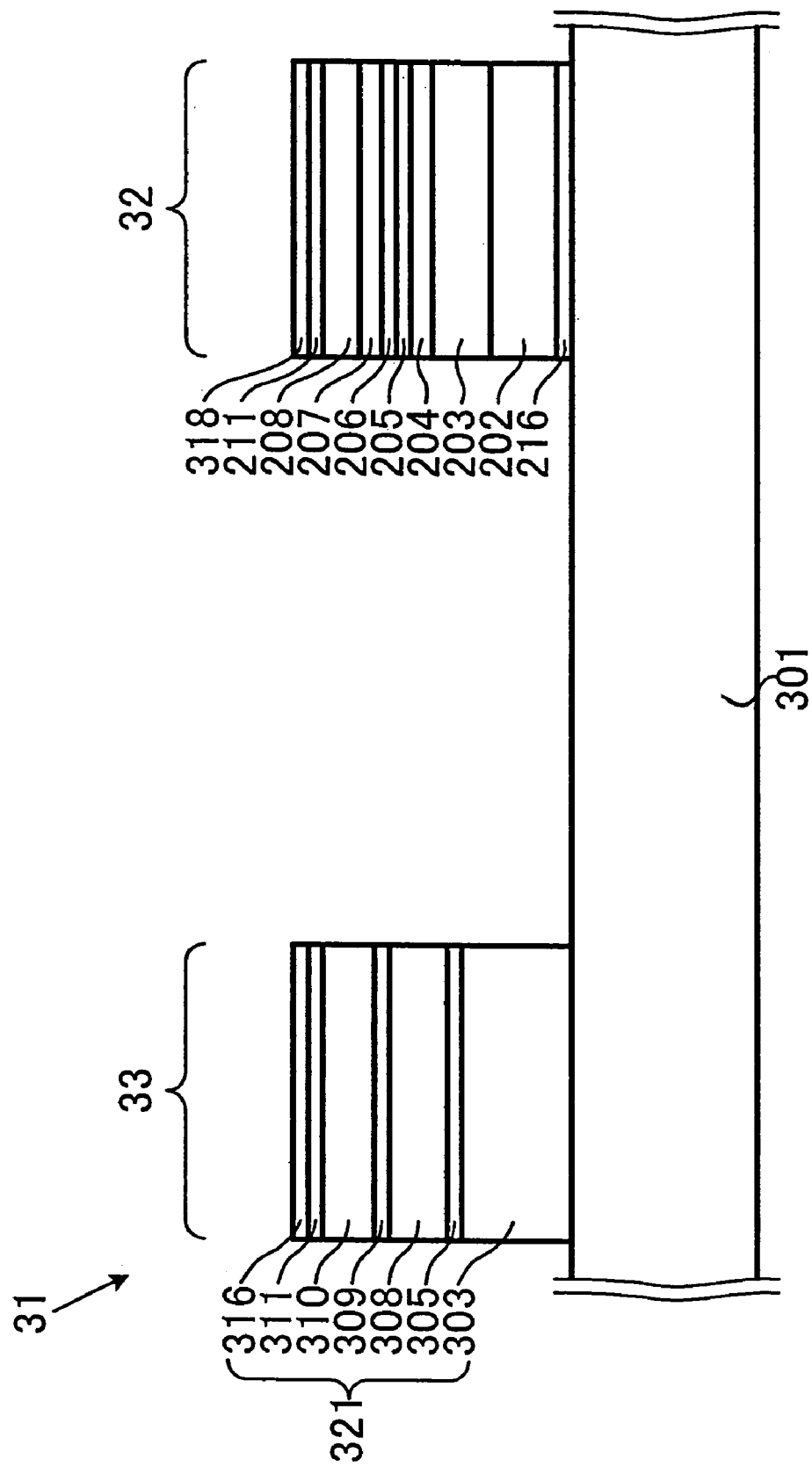
FIG. 11 is a schematic cross sectional view showing a fabricating step of the infrared laser portion in FIG. 9.

Then, as shown in, FIG. 11, with protective films 318 being left, infrared laser portions 33 are formed on the exposed n-type GaAs substrate 301. First, similarly to the infrared LD in embodiment 1, a plurality of AlGaAs-based semiconductor layers up to p-type GaAs upper contact layer 311 are crystal-grown. At this time, the surface level (height) of upper contact layer 311 at the end of the growth is adjusted to be approximately equal to the surface level of upper contact layer 211 of blue laser portion 32, for example, by adjusting thickness of lower cladding layer 303. Subsequently, a protective film 316 made of silicon oxide, silicon nitride or the like is formed on the entire surface of the wafer by CVD or vacuum evaporation, and strip-like openings are provided in protective film 316 by a photolithographic process. Infrared laser portions 33 are formed at positions where strip-like protective films 316 are left at this time. The widths of each strip-like protective film 316 and each opening are set to 200 µm and 550 µm, respectively. Each protective film 316 is left between blue laser portions 32, and one side of protective film 316 is set to be at a position 300 µm apart from one blue laser portion 32. As a result, the other side of protective film 316 is automatically located at a position 50 µm apart from the other blue laser portion 32.

FIG. 11 shows protective film 316 located at a distance of 300 µm from blue laser portion 32 to the left. Then, the strip-like openings among protective films 316 are dug down by wet-etching or dry-etching to form gaps to be provided with infrared laser portions 33. In this step, a plurality of AlGaAs-based semiconductor layers grown on regions to be provided with the infrared laser portions and on blue laser portions 32 are removed to separate blue laser portions 32 from infrared laser portions 33. As a result, a narrow gap having a width of approximately 50 µm or a wide gap having a width of approximately 300 µm is formed between the mesa for serving as the blue laser portion and the mesa for serving as the infrared laser portion. N-type GaAs substrate 301 is exposed in these gaps. Red laser portions 34 are formed in the wide gaps.

Figure 12:
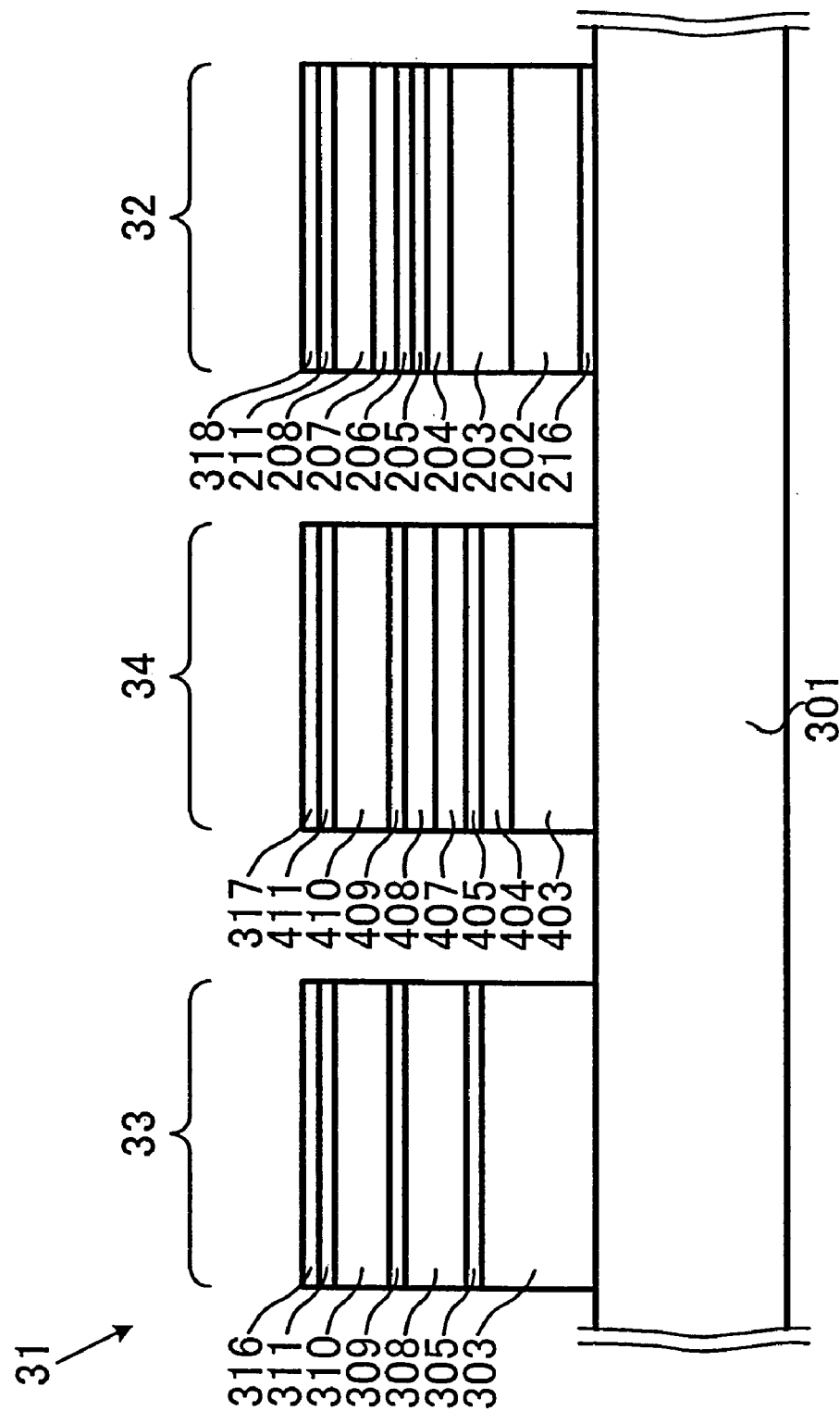
FIG. 12 is a schematic cross sectional view showing a fabricating step of the red laser portion in FIG. 9.

Then, as shown in FIG. 12, with protective films 318 and 316 being left, red laser portions 34 are formed on the exposed n-type GaAs substrate 301. First, similarly to the red LD in embodiment 1, a plurality of InGaAlP-based semiconductor layers up to p-type GaAs upper contact layer 411 are crystal-grown. The surface level (height) of upper contact layer 411 at the end of the growth is adjusted to be approximately equal to the surface level of the upper contact layers of the other laser portions, for example, by adjusting thickness of lower contact layer 403. Subsequently, similarly to infrared laser portions 33, a protective film 317 is formed, and strip-like openings are provided by a photolithographic process. Locations where protective films 317 are to be left are at positions 50 µm or more apart from each blue laser portion 32 and each infrared laser portion 33. These locations correspond to the wide gaps between blue laser portions 32 and infrared laser portions 33. The width of each strip-like protective film 317 to be left is 200 µm. Thereafter, dry-etching or wet-etching is carried out from the strip-like openings among protective films 317 to form red laser portions 34 and to separate the same from the other laser portions.

Figure 13:
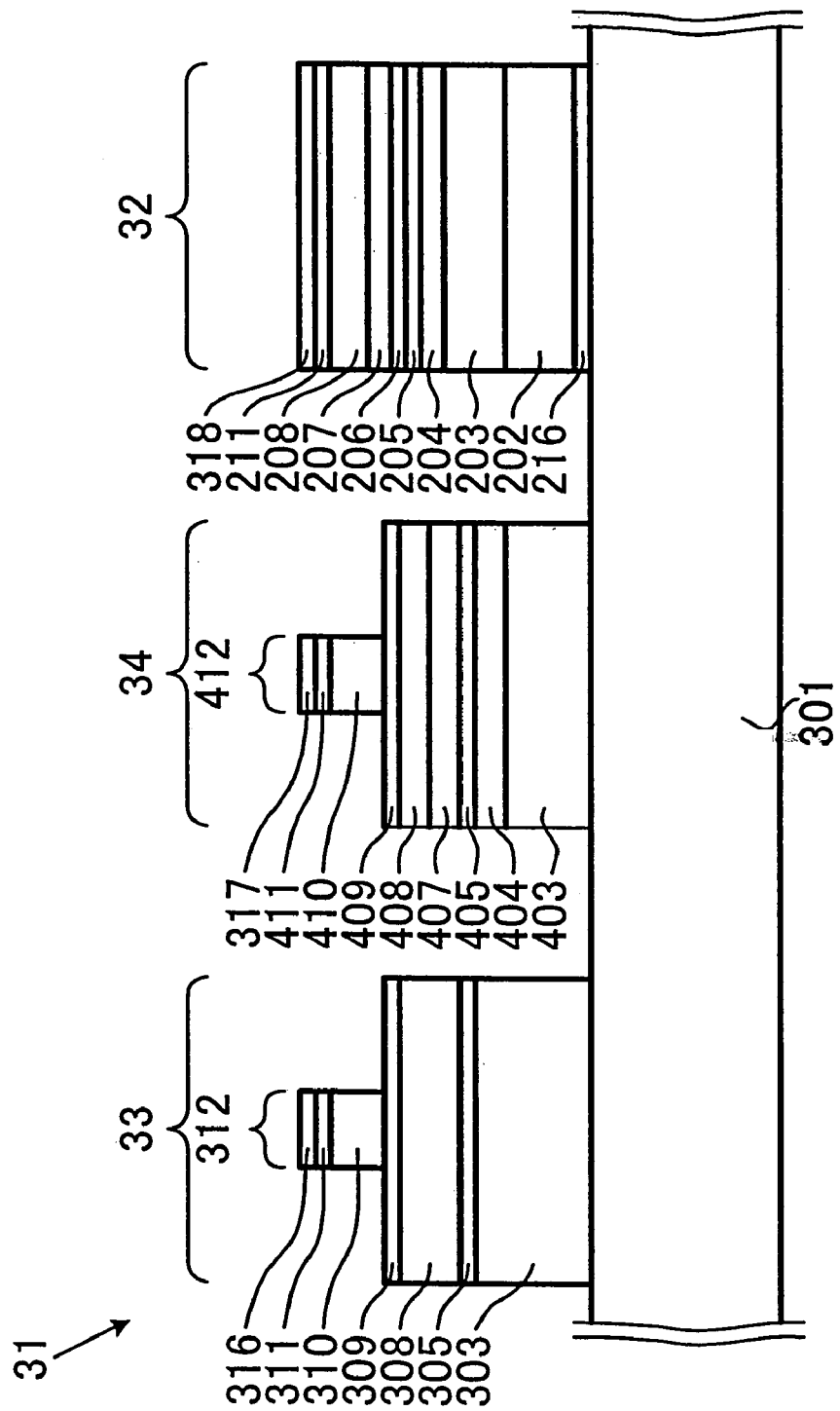
FIG. 13 is a schematic cross sectional view showing a fabricating step subsequent to that of FIG. 12.

Then, as shown in FIG. 13, ridge stripes of infrared laser portion 33 and red laser portion 34 are formed. First, strip-like protective films 316 and 317 are processed in a stripe shape having a narrower width of approximately 4 µm using a photolithographic process. This photolithographic process can be carried out at a time since the heights of the laser portions are approximately equal. Thereafter, upper contact layers 311, 411 and upper second cladding layers 310, 410 are wet-etched until etch stop layers 309, 409 are reached, thereby forming ridge stripes 312, 412 of laser portions 33, 34.

Figure 14:
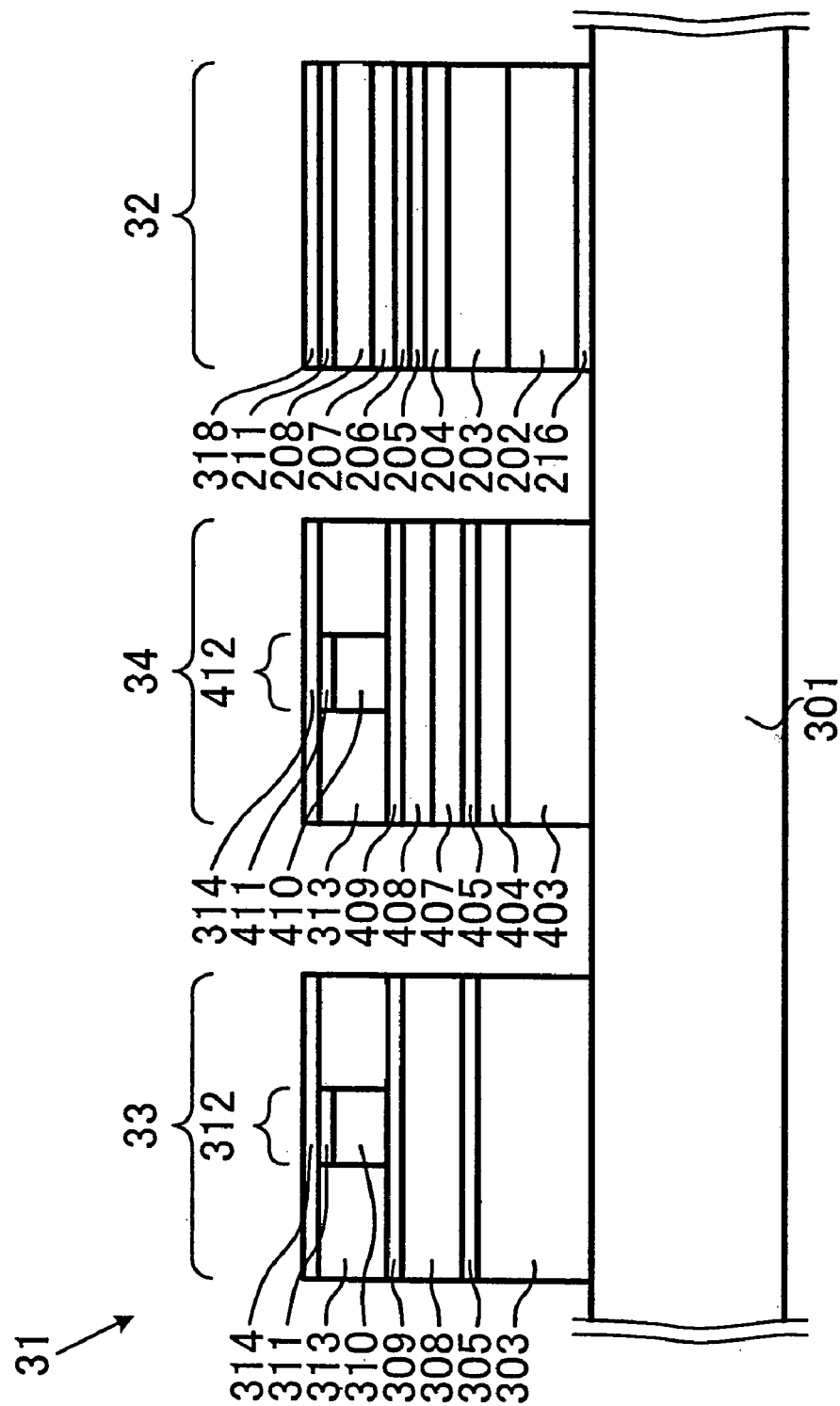
FIG. 14 is a schematic cross sectional view showing a manufacture step subsequent to that of FIG. 13.

Furthermore, as shown in FIG. 14, ridge stripes 312, 412 are buried in n-type GaAs filling layer 313, and unnecessary regions of the n-type GaAs layer deposited on the ridge stripes are removed. If the n-type GaAs filling layer is grown in the gap separating the laser portions from each other, it is also removed as a matter of course. Thereafter, p-electrode layer 314 is formed on ridge stripes 312, 412 and on filling layers 313 by evaporating Zn/Au in this order, similarly as in embodiment 1. The p-electrodes of infrared laser portion 33 and red laser portion 34 can be formed simultaneously since they are made of the same material. Ridge stripes 312 and 412 of infrared laser portion 33 and red laser portion 34 are formed prior to ridge stripe 212 of blue laser portion 32, because these ridge stripes 312 and 412 need to be buried in the n-type GaAs. In other words, this prevents p-electrode 213 of blue laser portion 32 from being heated excessively and degraded.

Figure 15:
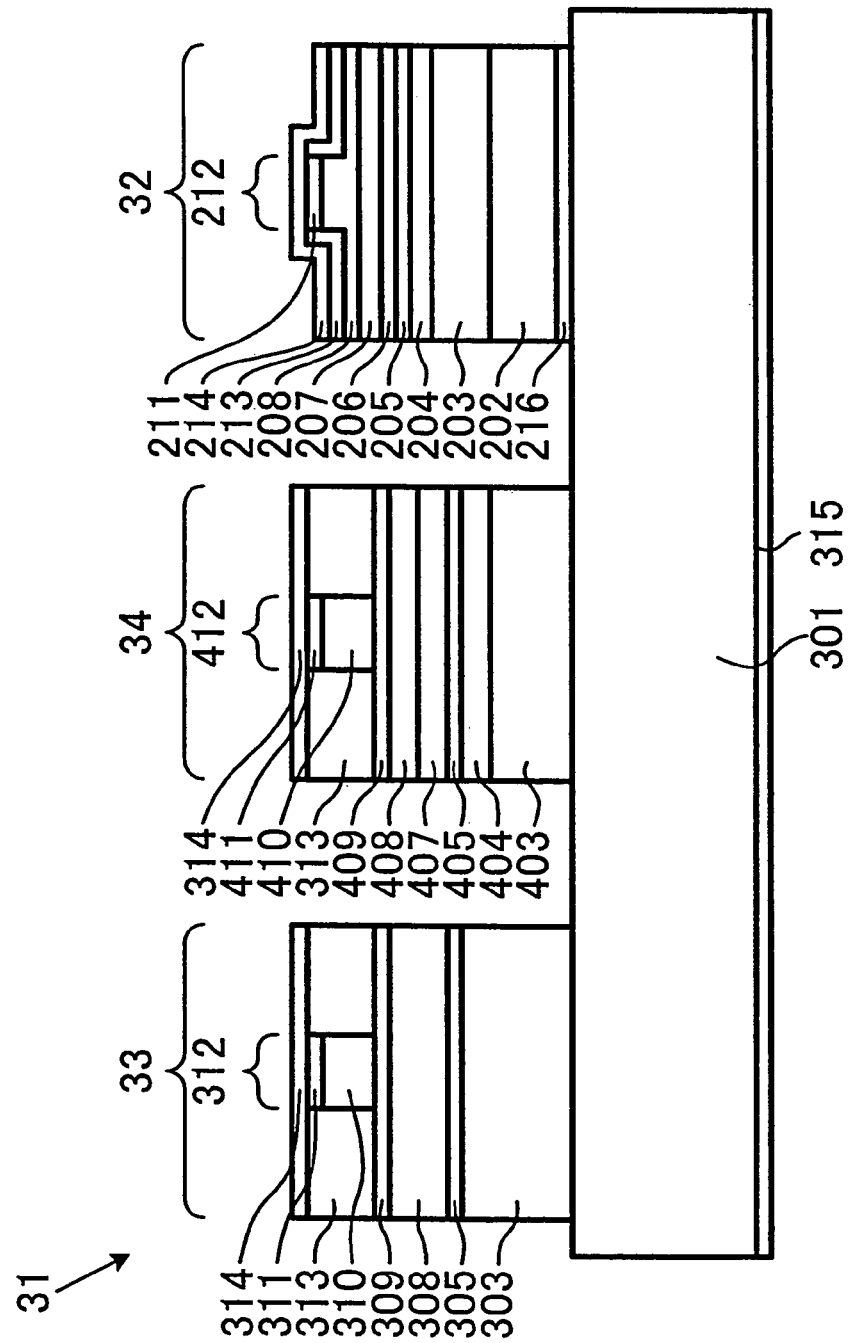
FIG. 15 is a schematic cross sectional view showing a manufacture step subsequent to that of FIG. 14.

Then, as shown in FIG. 15, ridge stripe 212 of blue laser portion 32 is formed. A protective film (not shown) for protecting infrared laser portion 33 and red laser portion 34 is formed, and a photolithographic process is used to process protective film 318 in a stripe shape having a narrow width of approximately 2 µm. Thereafter, upper contact layer 211 and upper cladding layer 208 are etched by RIE to such an extent that upper cladding layer 208 is left at a thickness of approximately 0.03 µm, thereby forming ridge stripe 212. Current-constricting layers 213 and p-electrode 214 are then formed, thereby finishing blue laser portion 32.

After the three kinds of laser portions are formed in this way, both the mirror facets of each laser portion are formed as etched mirrors. At that time, the laser light emission point of blue laser portion 32 is formed 80 µm ahead of the emission point of red laser portion 34, and the emission point of red laser portion 34 is formed 60 µm ahead of the emission point of infrared laser portion 33. To this end, after a resist pattern is formed by a photolithographic process, the mirror facets normal to each of ridge stripes 212, 312 and 412 are formed using either or both of wet-etching and dry-etching. In embodiment 3, the length of every cavity is set at 500 µm. Thereafter, by abrading the second main surface side of n-type GaAs substrate 301, the thickness of the wafer is adjusted. An n-electrode 315 is formed by vacuum-evaporating Ni/Ge/Au in this order, and then Mo/Au are stacked in this order by vacuum evaporation to facilitate mounting of LD 31. The wafer is thus finished.

Thereafter, the finished wafer is cleaved in a bar shape. In dividing the wafer in the bar shape, the cleavage has to be carried out in such a manner that the mirror facets are not damaged. During the etching to form the mirror facets, for example, the wafer is designed to have sufficient margins for the cleavage. Specifically, in embodiment 3, narrow regions of a 20 µm width normal to the ridge stripes are provided as cleavage margins ahead of the mirror facet on the front side of blue laser portion 32 and behind the mirror facet on the rear side of infrared laser portion 33.

A multilayer reflective film (not shown) is formed on the rear side of the cleaved bar. This multilayer reflective film is designed to have a high reflectance with respect to the wavelength of light generated in each of the three kinds of laser portions. For the multilayer reflective film, it is possible to use materials having various reflectances, for example, oxides such as $SiO_2$, $TiO_2$, $Al_2O_3$, and $ZrO_2$, as well as nitrides, sulfides, and halides. It is also possible to consider various combinations of the materials that satisfy the desired condition of the multilayer reflective film. Incidentally, it is noted that the materials to be actually used has to be insulative as it is coated on the mesa end surface. Finally, the laser bar is divided between blue laser portion 32 and infrared laser portion 33 adjacent to each other, thereby finishing LD 31. Thereafter, in this embodiment 3 also, wires 18, 19 and 20 are connected similarly as in embodiment 1.

It is needless to say that the similar effects as in embodiment 1 can also be obtained in embodiment 3, since the laser light emission points of the laser portions are arranged with one behind another in the light emitting direction in increasing order of the wavelengths.

Here, the mirror facets 220, 320 and 420 of the laser portions in embodiment 3 are all etched mirrors as described above. As can be seen with reference to FIG. 9, in the case of the LD using etched mirrors, dividing lines 50 of the LD does not coincide with the mirror facets. Thus, there is a possibility that light beams emitted from mirror facets 220, 320 and 420 are partially interrupted by the upper surface of substrate 301. Therefore, the reference based on the above expressions (1) and (2) needs to be used to etch the substrate surface in such a manner that the laser radiation pattern is not interrupted. Specifically, it is necessary to carry out etching deeply enough during the formation of the etched mirrors or to etch only passageways for laser beams deeply enough by using a photolithographic technique.

Figure 16A:
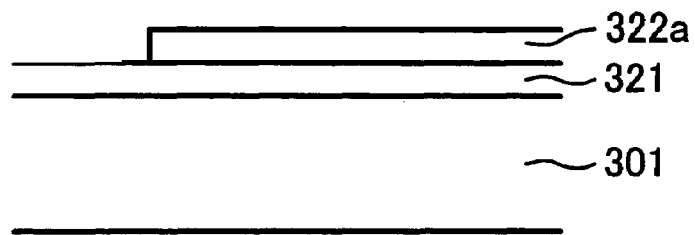
FIGS. 16A to 16D are schematic cross sectional views showing steps of forming an mirror facet of the infrared laser portion in FIG. 9.
Figure 16B:
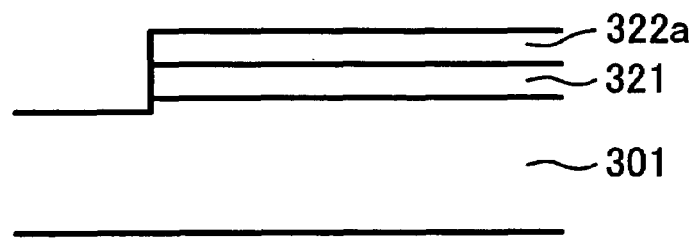
Figure 16C:
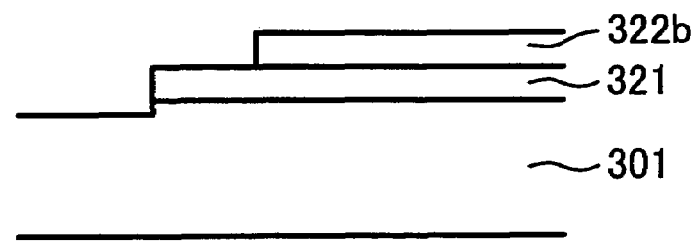
Figure 16D:
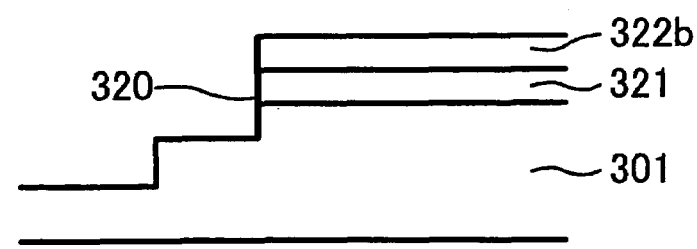

Schematic cross sectional views in FIGS. 16A to 16D show steps of forming a passageway of laser light by using a photolithographic technique, taking infrared laser portion 33 as an example. In FIGS. 16A to 16D, a plurality of semiconductor layers on substrate 301 shown in FIG. 11 are designated collectively as an epitaxial growth portion 321. FIGS. 16A to 16D are cross sectional views taken along the y-z plane of FIG. 8. First, as shown in FIG. 16A, a resist pattern 322a is formed on epitaxial growth portion 321. In FIG. 16B, using resist pattern 322a as a mask, dry-etching is carried out to dig a partial area of epitaxial growth portion 321. In FIG. 16C, after removing off resist pattern 322a, a new resist pattern 322b is formed. In FIG. 16D, using resist pattern 322b as a mask, dry-etching is carried out again to deeply dig another partial area of epitaxial growth portion 321 to form mirror facet 320. Since mirror facet 320 is the light emitting facet, etching needs to be carried out until substrate 301 is reached in order that the emitted laser light is not interrupted. Thereafter, resist pattern 322b is removed off, whereby LD 31 free from interruption of laser light is completed.

(Embodiment 4)

Figure 17:
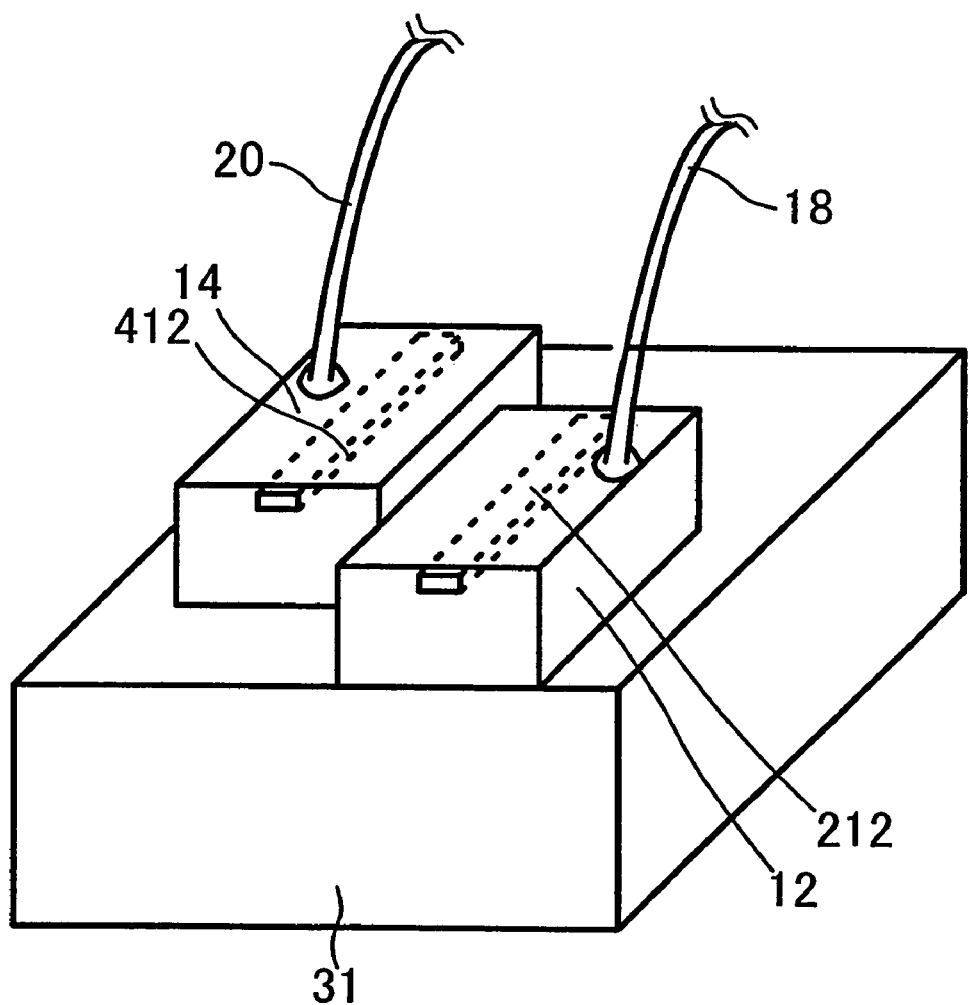
FIG. 17 is a schematic perspective view of a header portion of a stem in a multi-wavelength laser device according to embodiment 4 of the present invention.
Figure 18:
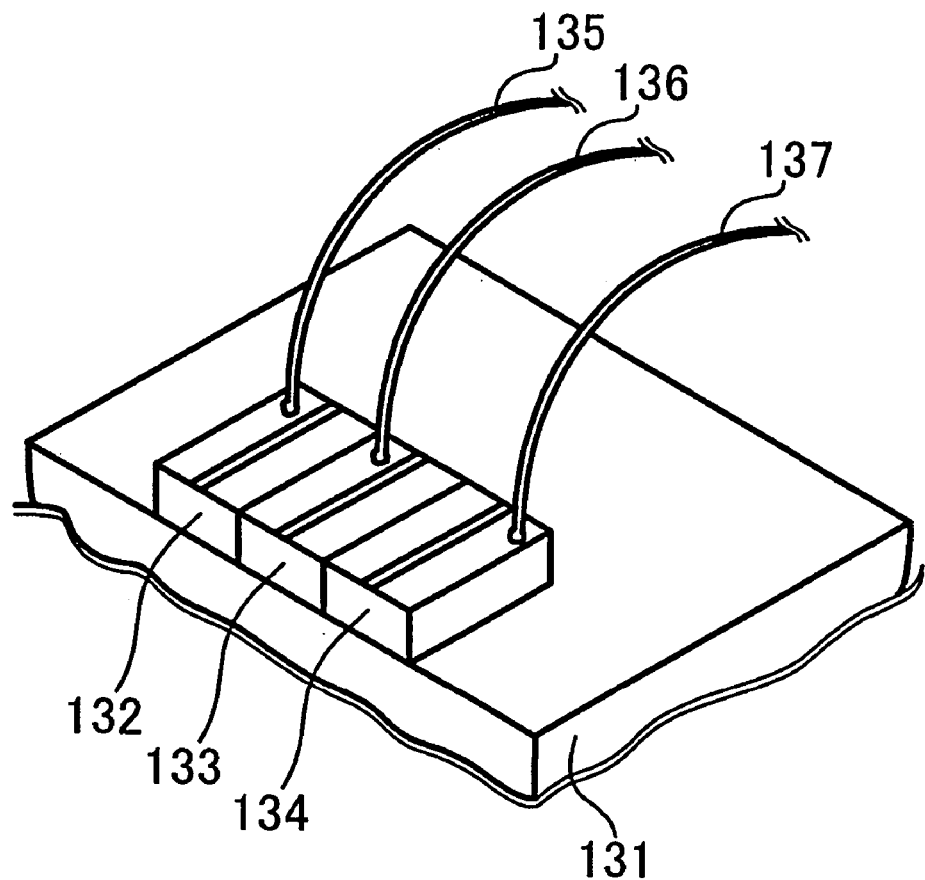
FIG. 18 is a schematic perspective view of a hybrid-type multi-wavelength laser device according to the prior art.

FIG. 17 is a perspective view schematically illustrating a front portion of a stem of a multi-wavelength laser device in embodiment 4. In embodiment 2 of FIG. 17, the same or corresponding parts as in embodiment 1 are denoted with the same reference numbers and the detailed description thereof will not be repeated.

Although embodiment 4 is similar to embodiment 1, a characterized feature thereof is that the multi-wavelength laser device is-formed of blue LD 12 and red LD 14. The laser light emission point of blue LD 12 is arranged 40 µm ahead of the emission point of red LD 14 in the light emitting direction.

The similar effects as in embodiment 1 can also be obtained in embodiment 4, since the laser light emission points are arranged with one behind another in the light emitting direction in increasing order of the wavelengths.

While a variety of embodiments according to the present invention have been described above, the features of the embodiments may be combined as appropriate. Although the red LD sandwiched between the other LDs has been shown as an example of arrangement of the LDs, any one of the LDs may be arranged at the center.

As described above, according to the present invention, a plurality of laser light emission point positions in the multi-wavelength laser device are arranged with one behind another in the light emitting direction in increasing order of the wavelengths, so that it is possible to focus the light beams onto a position of the same focal length with a single optical system without being affected by the difference between their wavelengths. In addition, since the laser light emission point position can be easily changed so as to meet a requirement of an optical system to be used, the optical system can be simplified when incorporated into an optical pickup, thereby reducing the costs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multi-wavelength laser device configured for use with an optical system, the laser device comprising at least two of a blue laser diode, a red laser diode, and an infrared laser diode, which are arranged on the same base to emit in at least approximately a same light emitting direction, wherein laser light emission points of the laser diodes are arranged with one behind another in the light emitting direction in order of wavelengths of the laser diodes with the laser emission point of the shortest wavelength laser diode positioned farthest in the light emitting direction and with spacings between the laser emission points in the light emitting direction that compensate for a wavelength dependence of a focal length of the optical system.

2. The multi-wavelength laser device according to claim 1, wherein said at least two laser diodes are formed monolithically on the same substrate.

3. The multi-wavelength laser device according to claim 2, wherein said substrate is provided with a cut for ensuring passage of laser light from each of said laser diodes.

4. The multi-wavelength laser device according to claim 1, wherein said at least two laser diodes are mounted on said base using respective solders with different melting points.

5. The multi-wavelength laser device according to claim 1, wherein said base is provided with a cut for ensuring passage of laser light from each of said laser diodes.

6. The multi-wavelength laser device according to claim 1, wherein each of said diodes is mounted with its p-side down.

7. A method of manufacturing a multi-wavelength laser device, the method comprising:

arranging at least two of a blue laser diode, a red laser diode, and an infrared laser diode on a same base to emit in at least approximately a same light emitting direction;

wherein laser light emission points of the laser diodes are arranged with one behind another in the light emitting direction in order of wavelengths of the laser diodes with the laser emission point of the shortest wavelength laser diode positioned farthest in the light emitting direction and with spacings between the laser emission points in the light emitting direction that compensate for a wavelength dependence of a focal length of the optical system; and wherein said at least two laser diodes are mounted on said base using solders with respective different melting points in decreasing order of the melting points.

8. A multi-wavelength laser device comprising at least two of a blue laser diode, a red laser diode, and an infrared laser diode, which are arranged on the same base to emit in at least approximately a same light emitting direction, wherein laser light emission points of the laser diodes are arranged with one behind another in the light emitting direction in order of wavelengths of the laser diodes with the laser emission point of the shortest wavelength laser diode positioned farthest in the light emitting direction;

a first one of the laser diodes and a second one of the laser diodes are arranged with the laser emission point of the first laser diode a distance L behind the laser emission point of the second laser diode, and with the laser emission point of the first laser diode a distance W from the second laser diode in a direction perpendicular to the light emitting direction in a horizontal plane parallel to the base;

$$W \geq L \times \tan(\theta/2);$$

and $\theta/2$ is the divergence angle in the horizontal plane of a light beam emitted by the first laser diode.

9. The multi-wavelength laser device according to claim 8, wherein said at least two laser diodes are formed monolithically on the same substrate.

10. The multi-wavelength laser device according to claim 9, wherein said substrate is provided with a cut for ensuring passage of laser light from each of said laser diodes.

11. The multi-wavelength laser device according to claim 8, wherein said at least two laser diodes are mounted on said base using respective solders with different melting points.

12. The multi-wavelength laser device according to claim 8, wherein said base is provided with a cut for ensuring passage of laser light from each of said laser diodes.

13. The multi-wavelength laser device according to claim 8, wherein each of said diodes is mounted with its p-side down.

14. A method of manufacturing a multi-wavelength laser device, the method comprising:

arranging at least two of a blue laser diode, a red laser diode, and an infrared laser diode on a same base to emit in at least approximately a same light emitting direction; wherein laser light emission points of the laser diodes are arranged with one behind another in the light emitting direction in order of wavelengths of the laser diodes with the laser emission point of the shortest wavelength laser diode positioned farthest in the light emitting direction;

a first one of the laser diodes and a second one of the laser diodes are arranged with the laser emission point of the first laser diode a distance L behind the laser emission point of the second laser diode, and with the laser emission point of the first laser diode a distance W from the second laser diode in a direction perpendicular to the light emitting direction in a horizontal plane parallel to the base;

$$W \geq L \times \tan(\theta/2);$$

$\theta/2$ is the divergence angle in the horizontal plane of a light beam emitted by the first laser diode; and wherein said at least two laser diodes are mounted on said base using solders with respective different melting points in decreasing order of the melting points.

* * * * *